United States Patent
Fukuda et al.

[11] Patent Number: 5,151,255
[45] Date of Patent: Sep. 29, 1992

[54] METHOD FOR FORMING WINDOW MATERIAL FOR SOLAR CELLS AND METHOD FOR PRODUCING AMORPHOUS SILICON SOLAR CELL

[75] Inventors: Nobuhiro Fukuda; Sadao Kobayashi; Kenji Miyachi; Hidemi Takenouchi, all of Yokohama; Yoji Kawahara, Hiroshima; Takayuki Teramoto, Yokohama, all of Japan

[73] Assignee: Mitsui Toatsu Chemicals, Inc., Tokyo, Japan

[21] Appl. No.: 593,480

[22] Filed: Oct. 3, 1990

Related U.S. Application Data

[63] Continuation of Ser. No. 439,433, Nov. 21, 1989, abandoned, which is a continuation of Ser. No. 114,595, Oct. 30, 1987, abandoned, which is a continuation-in-part of Ser. No. 766,968, Aug. 19, 1985, abandoned.

[30] Foreign Application Priority Data

Aug. 20, 1984 [JP] Japan .................. 59-171436

[51] Int. Cl.$^5$ .................. B01J 19/08; B01J 19/12
[52] U.S. Cl. .................. 422/186.05; 427/39; 427/74; 427/162; 437/101; 357/30; 136/258; 148/DIG. 1

[58] Field of Search .................. 427/39, 74, 161, 162, 427/167; 136/298; 357/2, 30, 59, 60; 148/DIG. 1; 437/9, 100, 101; 422/186.05

[56] References Cited

U.S. PATENT DOCUMENTS

| | | | |
|---|---|---|---|
| 3,424,661 | 1/1969 | Androshuk et al. | 204/164 |
| 4,368,828 | 12/1982 | Brodsky et al. | 427/39 |
| 4,451,538 | 5/1984 | Tanner | 428/447 |
| 4,507,519 | 5/1985 | Kasumi et al. | 136/258 |
| 4,532,196 | 7/1985 | Yasui et al. | 430/31 |

OTHER PUBLICATIONS

A. Lucousky et al., Phys. Rev. B19 (1979), p. 2064.
D. J. Fary et al., J. Non-Cryst. Solids, 35-36 (1980), pp. 255, etc.
F. W. Sears et al., University Physics, (1953, p. 64.

*Primary Examiner*—J. W. Eldred
*Attorney, Agent, or Firm*—Fisher, Christen & Sabol

[57] ABSTRACT

A method for forming a dihydride rich amorphous silicon semiconductor film suitable for use as a window material of solar cells only from a silicon material, which comprises decomposing a gaseous mixture composed of disilane, a dopant capable of imparting p-type electrical conductivity and a diluent gas by applying a glow discharge energy, and thereby forming a semiconductor film having an optical band gap of at least 1.8 eV, preferably more than 1.9 eV, on a substrate.

6 Claims, 4 Drawing Sheets

METHOD FOR FORMING WINDOW MATERIAL FOR SOLAR CELLS AND METHOD FOR PRODUCING AMORPHOUS SILICON SOLAR CELL

This application is a continuation of prior U.S. application Ser. No. 07/439,433, field Nov. 21, 1989, abandoned, which is a continuation of application Ser. No. 07/114,595, filed Oct. 30, 1987, abandoned, which is a continuation-in-part of application Ser. No. 07/766,968, filed Aug. 19, 1985, abandoned.

BACKGROUND OF THE INVENTION

1. Field of the Invention

This invention relates to a method for forming a semiconductor film having amorphous silicon which has a wide optical band gap and is suitable for use as a window material for solar cells. This invention also relates to a method of producing an amorphous silicon solar cell having a high photo-voltaic conversion efficiency at high speeds.

2. Background Art

Amorphous silicon (to be referred to as a-Si:H) films have recently been investigated extensively, and have found wide applications in solar cells, photosensitive drums, scanning circuits for image reading devices and driving circuits for image display devices.

When such a-Si:H films are applied to semiconductor devices such as a window material for solar cells, they desirably have as large an optical band gap (to be sometimes referred to as Eopt) as possible because light having a greater energy than Eopt is shut off by the a-Si:H layer before reaching the optically active layer and is not effectively utilized.

With the prior art, it is difficult to form such a window material from a silicon material alone. For example, a p-type layer formed of monosilane has an Eopt of about 1.6 eV at the highest. Hence, amorphous silicon carbide (to be referred to as a-SiCx) and amorphous silicon nitride (to be referred to as a-SiNy) have been studied, and p-type a-SiCx doped with boron has come into practical use as a window material for hetero junctions.

The a-SiCx and a-SiNy, however, are intrinsically difficult of electrical conduction, and when they are used as a window material, their low electric conductivity gives rise to various problems. If its Eopt is increased excessively by increasing x or y, the loss of an electric current owing to the decrease of electrical conductivity becomes larger than the advantage of taking up light of short wavelengths, and the overall photovoltaic conversion efficiency of the material is decreased.

Thus, the Eopt cannot be increased too much by increasing the x or y value. For example, the balance between Eopt and electrical conductivity in p-type a-SiCx is regarded as best when it is used with an Eopt of 1.9 to 2.0 eV, but at this time, its electric conductivity is as low as about $10^{-7}$ s.cm$^{-1}$. Hence, in a photovoltaic converting element such as a solar cell, this window material acts as a considerable resistance component and is very disadvantageous to the improvement of its photovoltaic conversion efficiency.

For the formation of a-SiCx, a carbon source must be used as a raw material. This inevitably results in the deposition of carbon inside a glow discharge chamber, and a new problem of removing the deposited carbon arises. Furthermore, since the conductivity of a-SiCx is greatly affected by its x value. the proportions of the silicon material and the carbon material must be strictly controlled, and the process of making a window material from a-SiCx becomes complex.

BROAD DESCRIPTION OF THE INVENTION

It is an object of this invention to provide a method for forming an amorphous silicon semiconductor film suitable as a window material having a large Eopt and a high electrical conductivity from a silicon material alone without introducing carbon or nitrogen.

Another object of this invention is to provide a method for forming such a window material by the glow discharge decomposition of disilane as a starting material without introducing carbon or nitrogen.

Still another object of this invention is to provide a method for forming an amorphous silicon semiconductor film having electrical conductivity of p- or n-type suitable as a window material from disilane as a starting material.

Yet another object of this invention is to provide a method for producing an amorphous silicon solar cell having a window made of an amorphous silicon semiconductor produced from a silicon material alone without introducing carbon or nitrogen.

A further object of this invention is to provide a method for producing an amorphous silicon solar cell having a window made of an amorphous silicon semiconductor film having p- or n-type electrical conductivity and an optically active layer made of intrinsic amorphous silicon.

According to this invention, there is provided a method for forming a window material for solar cells from a silicon material alone, said window material consisting of a dihydrogenated silicon-based amorphous silicon semiconductor film, which comprises decomposing a gaseous mixture composed of disilane, a substance capable of imparting p-type electrical conductivity and a diluent gas by applying a glow discharge energy in the range of 0.5 to 8.5 KJ per unit mass of disilane, and thereby forming on a substrate a semiconductor film having an optical band gap of at least 1.8 eV and containing 29 to 39 atomic % of hydrogen with 25 to 36 atomic % thereof being in the form of dihydride ($SiH_2$) and 3 to 6 atomic thereof being in the form of monohydride (SiH), said window material being combined with an intrinsic amorphous silicon layer which is formed by decomposing disilane alone or a gaseous mixture composed of disilane and a diluent gas by applying a glow discharge energy being larger than the energy used for forming the semiconductor film and in the range of 20 to 300 KJ per unit mass of disilane.

According to this invention, there is also provided a method for forming an amorphous silicon solar cell comprised of a substrate having a first electrode, (a) an amorphous silicon layer having p-type electrical conductivity, (b) an intrinsic amorphous silicon layer, (c) an amorphous silicon layer having n-type electrical conductivity, and a second electrode formed on the substrate in this order or in the reverse order, the amorphous silicon layer having p-type electrical conductivity being located as a window facing incident light; which comprises (1) forming an intrinsic amorphous silicon layer having a hydrogen content of 15 to 22 atomic % with 2 to 7 atomic % thereof being in the form of dihydride ($SiH_2$) and 12 to 16 atomic % thereof being in the form of monohydride (SiH), by applying a sufficiently large glow discharge energy in the range of 20 to 300 KJ per unit mass of disilane to disilane or a gaseous mixture of disilane and a diluent gas, and (2) forming an amorphous silicon layer, as a window, having p-type electrical conductivity and containing 29 to 39 atomic % of hydrogen with 25 to 36 atomic % thereof being in the form of dihydride (SiH$_2$) and 3 to 6 atomic % thereof being in the form of monohydride (SiH) by applying a glow discharge energy being lower than said glow discharge energy in step (1) and in the range of 0.5 to 8.5 KJ per unit mass of disilane to a gaseous mixture composed of disilane, a substance capable of imparting p-type electrical conductivity and a diluent gas.

In the present invention disilane is used as a material for forming the amorphous silicon film instead of the monosilane used in the prior art. Disilane is a gas composed mainly of Si$_2$H$_6$ which corresponds to a silane of general formula Si$_n$H$_{2n+2}$ in which n is 2. Desirably, disilane is of high purity, but it may contain higher silanes such as trisilane and tetrasilane (n is 3 and 4 in the above general formula) which behave in the same manner as disilane during glow discharge. The inclusion of monosilane is undesirable in this invention. The content of monosilane which is allowable is usually less than 15%, preferably less than 5%, more preferably less than 1%, especially preferably less than 0.1%, and most preferably almost 0%, by volume. If the monosilane content is larger, the fill factor of the resulting solar cell becomes abruptly poor. Disilane may be produced by a physical synthesizing method, such as by subjecting monosilane (a silane of the above formula in which n is 1) to silent discharge to change it partly to disilane, and separating the resulting disilane, or a chemical method such as the reduction of hexachlorodisilane. For the industrial production of solar cells, the use of chemically synthesized disilane is convenient because the chemical method can give disilane of stable quality in large quantities.

The substance capable of imparting p-type electrical conductivity used in this invention is a compound of an element of Group III of the periodic table, such as B$_2$H$_6$ (diborane). The substance capable of imparting n-type electrical conductivity is a compound of an element of Group V such as PH$_3$ (phosphine) or AsH$_3$ (arsine). The proportion of the conductivity imparting substance is 0.1 to 5 parts by volume, per 100 parts by volume of disilane.

H$_2$, He, Ne, Ar. etc. are used as diluent gases for diluting disilane, etc. The total amount of the diluent gas used is 4 to 20 parts by volume, preferably at least 10 parts by volume, per part by volume of disilane.

For diluting the substance capable of imparting p-type or n-type conductivity, the diluent gas is used in an amount of 10 to 1000 parts by volume per part by volume of this substance.

It is also preferred in this invention to form a-Si:H by using such a diluent gas. The use of this gas improves the reproducibility of the photoelectric characteristics of the resulting silicon layer. Presumably, the diluent gas reduces the influences of trace impurities and serves to alleviate damages of the film by plasma The degree of dilution is not particularly limited, but for the convenience of production and the exhibition of the aforesaid effect, it is preferably within the range of 5 to 20% by volume.

According to the method of this invention, a glow discharge energy sufficiently low per unit mass of disilane is applied to a gaseous mixture composed of disilane, the substance capable of imparting p- or n-type electrical conductivity and the diluent gas to decompose it and thereby form a semiconductor film on a substrate. The "sufficiently low glow discharge energy", as used herein, means a glow discharge energy low enough to impart an optical band gap of as high as at least 1.8 eV, preferably more than 1.9 eV.

It has been discovered for the first time by the present inventors that by applying a sufficiently low decomposition energy to disilane as a starting gas, an amorphous silicon semiconductor film which has an Eopt of at least 1.8 eV and can be suitably used directly as a window material can be formed.

The intensity of the sufficiently low glow discharge energy is specifically not more than 10 KJ, preferably not more than 5 KJ and more than 0.5 KJ, per unit mass of disilane.

The most characteristic feature of the present invention is that a film obtained by decomposing a gas predominantly of disilane by applying a glow discharge energy of low power as stated above is used as a window material. It should be noted that this film is such an SiH$_2$-rich film that at least 25 atomic % of hydrogen therein is in the form of dihydride (SiH$_2$).

Figure 1:
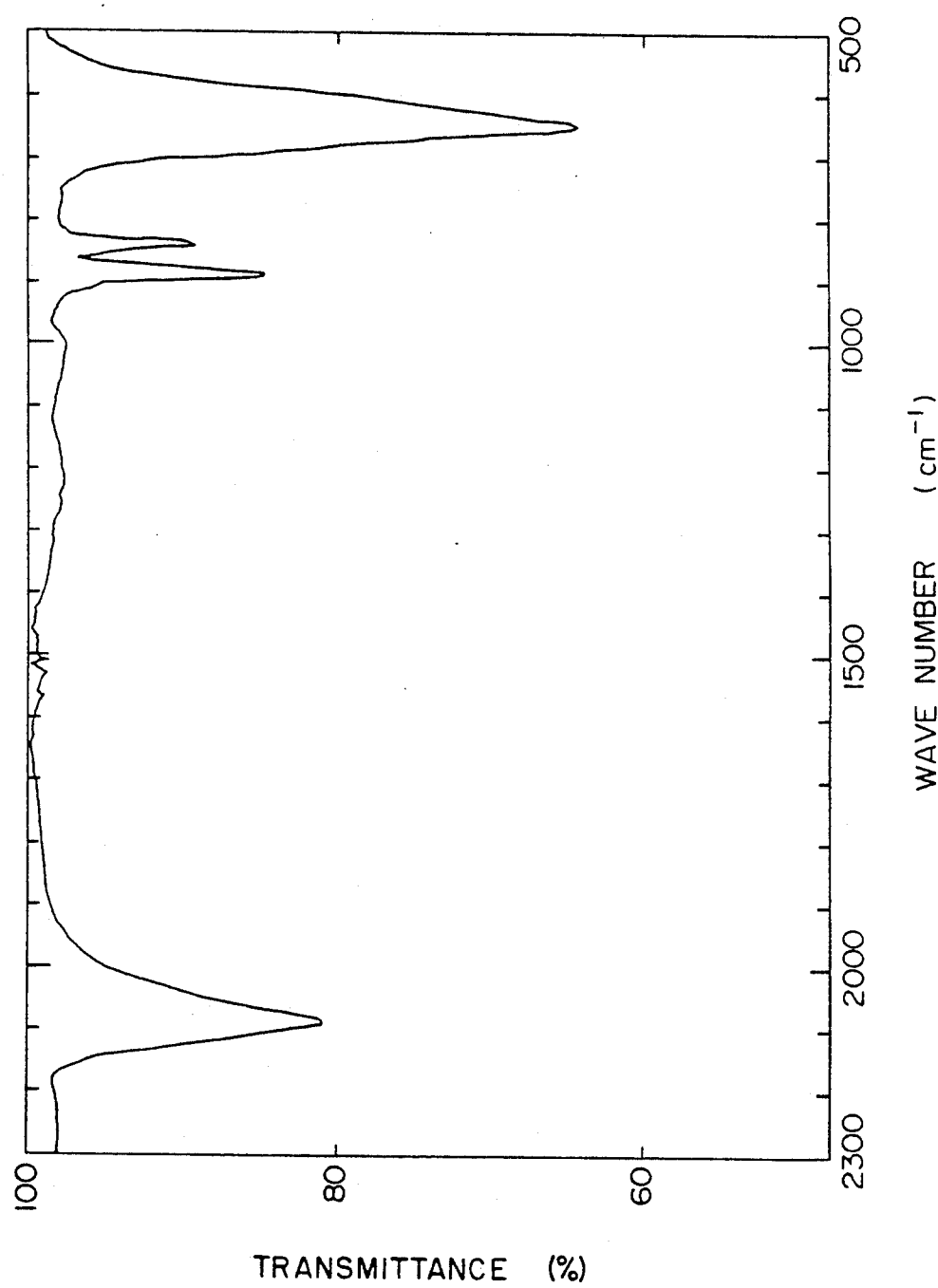
FIG. 1 is an infrared absorption spectral chart of the p-type window material obtained in a working example given hereinbelow. From this chart, only absorption peaks assigned to dihydride (SiH$_2$) are observed, and hardly any peaks are observed which are assigned to monohydride (SiH).
Figure 2:
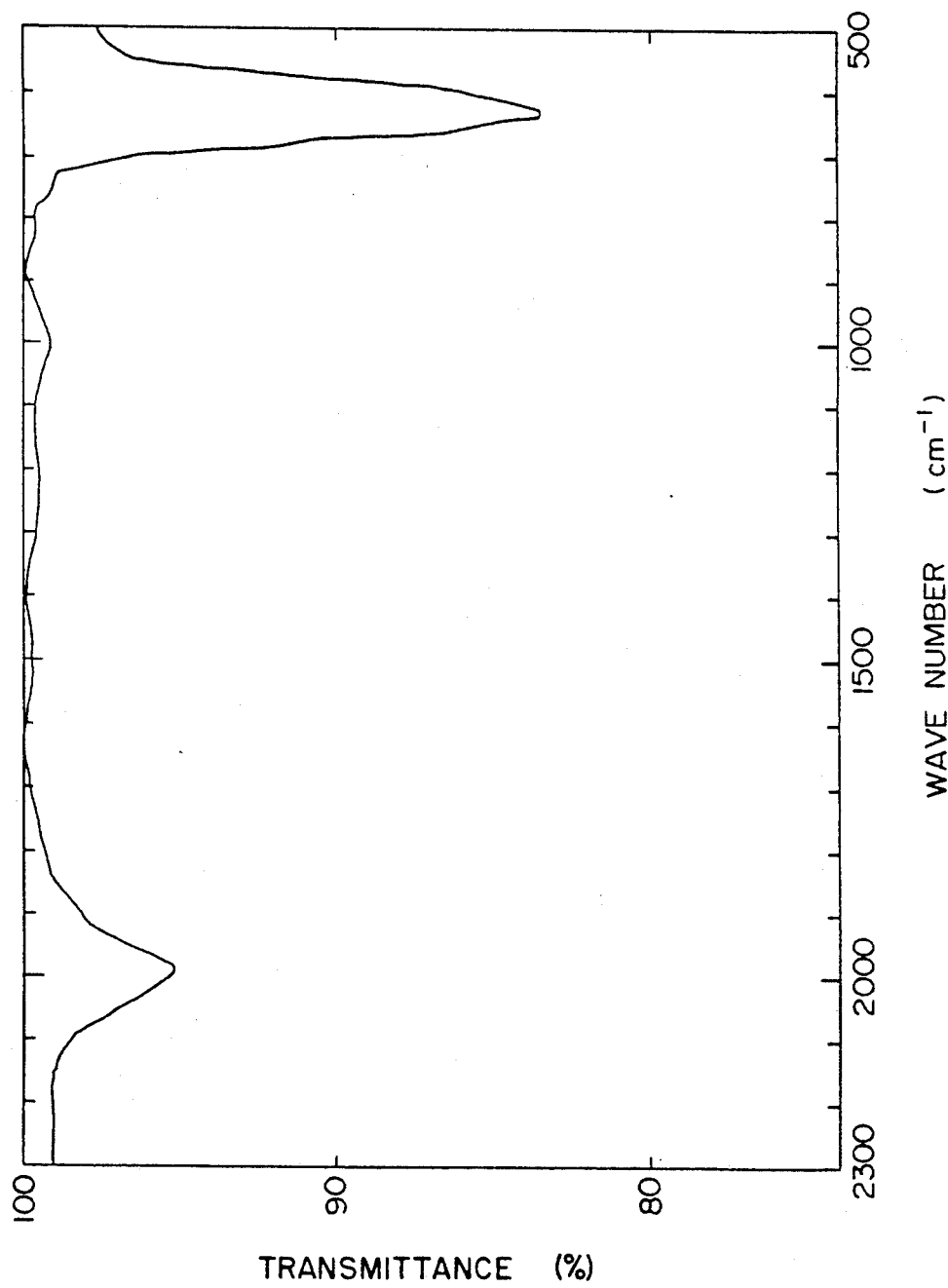
FIG. 2 is an infrared absorption spectrum chart of the i layer obtained in a working example hereinbelow. From this chart, absorption peaks assigned to monohydride (SiH) are mainly observed, and only a few peaks are assigned to dihydride (SiH$_2$).

The characteristic feature of the invention is that an SiH$_2$.-rich p-type window material of the type shown in FIG. 1 and an SiH-rich i-type optically active layer of the type shown in FIG. 2 are laid one on top of the other.

Figure 3:
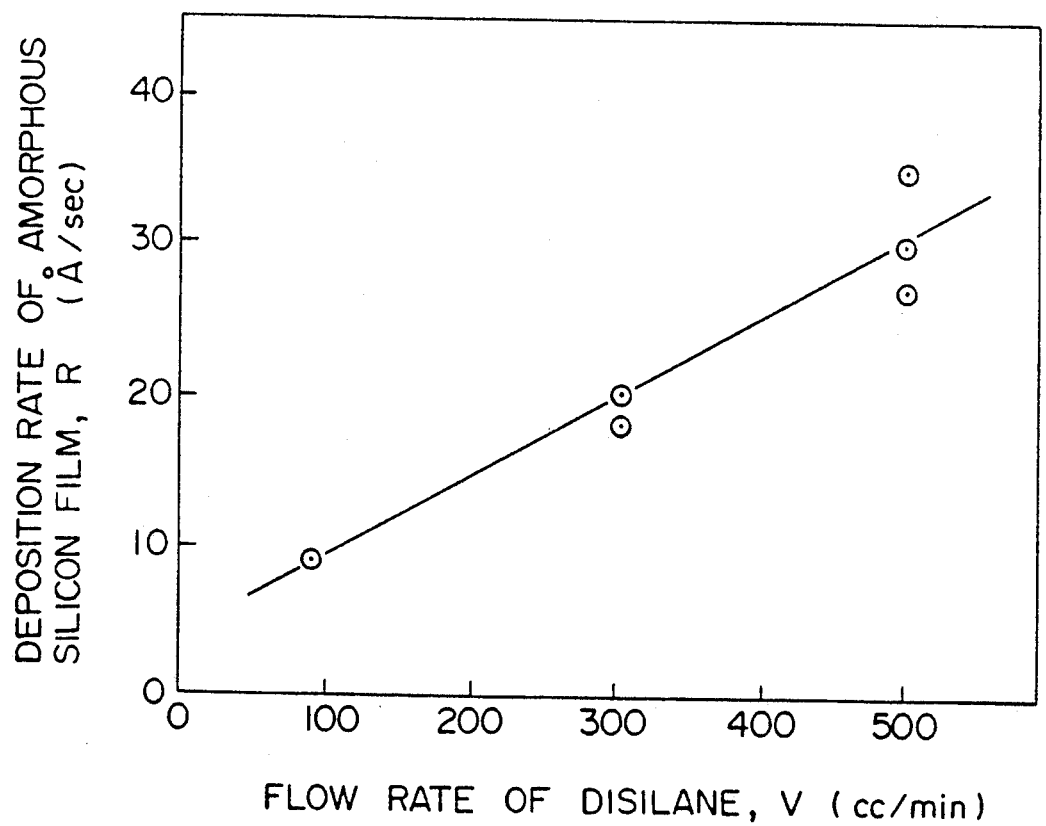

FIG. 3 is a graphic representation showing the relation between the flow rate of disilane and the deposition rate of the amorphous silicon film (the speed of formation of the silicon layer) in Examples 1 to 6. The abscissa V represents the flow rate in cc/min. of disilane, and the ordinate R, the deposition rate in Å/sec. of the amorphous silicon film.

Figure 4:
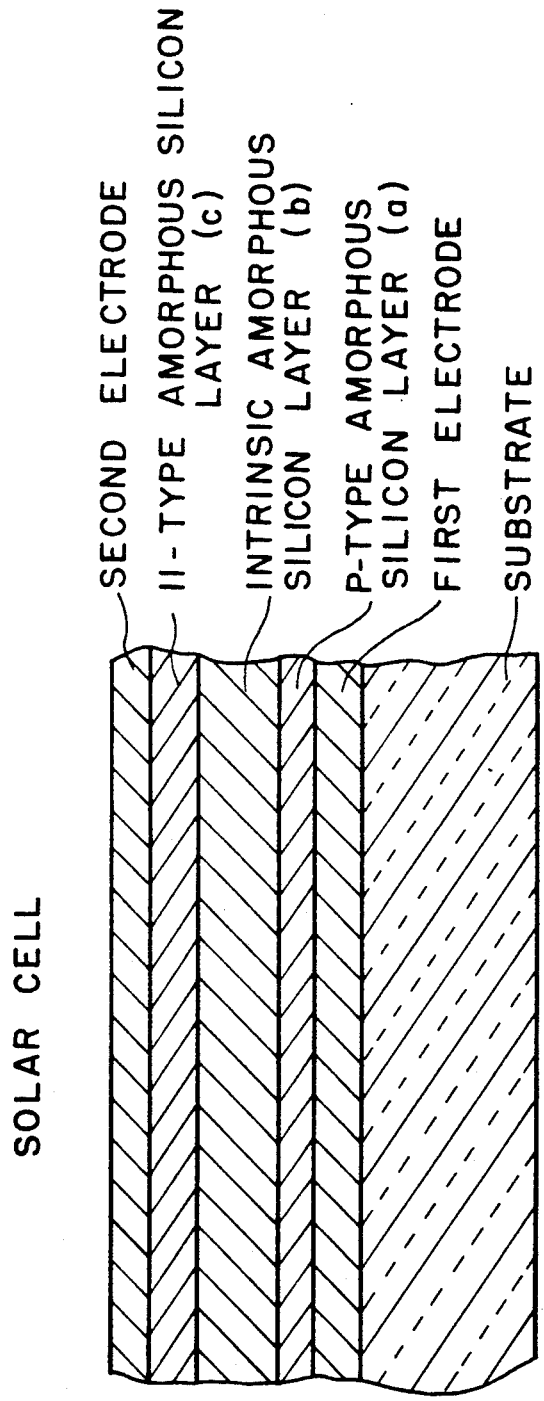

FIG. 4 is a vertical cross-section of a solar cell of the invention. The solar cell, from bottom to top, has a substrate, a first electrode, a p-type amorphous silicon layer (a), an intrinsic amorphous silicon layer (b), a n-type amorphous silicon layer (c) and a second electrode.

DETAILED DESCRIPTION OF THE INVENTION

Brodsky et al. (U.S. Pat. No. 4,363,828) discloses that a film of hydrogenated amorphous silicon is formed on a substrate by applying the glow discharge process to disilane. The applicant's invention, however, fundamentally differs from the invention of Brodsky et al. in that the window material of the applicant's invention is a dihydride (SiH$_2$)-rich film, whereas the Brodsky et al. film is a monohydride (SiH)-rich film. In this regard, Brodsky et al. state: "It will be understood by those skilled in the art that monohydrogenated amorphous silicon is now thought to be the most desirable hydrogenated material for semiconductor films." (column 5, lines 20-24). Brodsky et al. also state that the temperature should be elevated in order to avoid the formation of dihydride groups (column 5, lines 39-43).

Tanner proposed a method of producing an amorphous silicon film having a high band gap which can be used as a window material, for example (U.S. Pat. No. 4,451,538). According to the Tanner's method, a gaseous mixture of $SiH_4$ with at least 9 times its volume of $H_2$ is caused to flow at a flow rate of not more than $10^{-3}$ SCCM/cm$^2$, preferably $4.5 \times 10^{-4}$ SCCM/cm$^2$ to form a film. Hence, the rate of film formation is only 0.6 Å/sec. Tanner presumed the usability of higher silanes without giving any experimental data. However, in the formation of amorphous silicon by glow discharge decomposition, monosilane and disilane can never be dealt with within the same category. This can be substantiated from the fact that Brodsky et al. cited above use a very restricted reduced pressure condition of not more than 0.1 torr, preferably not more than 0.07 torr, in decomposing disilane.

According to this invention, an amorphous silicon solar cell can be produced by using the dihydride ($SiH_2$) rich amorphous silicon semiconductor film formed by the method described above as a window and an intrinsic monohydride (SiH) rich amorphous silicon layer (to be sometimes referred to as i-type a-Si:H) as an active layer. The dihydride ($SiH_2$) rich amorphous silicon film having p-type electrical conductivity as a window is formed by applying a sufficiently low decomposition energy, and the monohydride (SiH) rich amorphous silicon film (i-type a-Si:H) is formed by applying a sufficiently higher decomposition energy than the first-mentioned decomposition energy, and both of these films are formed from disilane as a main starting material. Thus, according to this invention, an amorphous silicon solar cell in which the Eopt of the window layer is sufficiently wider than the Eopt of the intrinsic amorphous silicon layer can be obtained in spite of using disilane alone as a main starting material without introducing carbon or nitrogen. Preferably, the intrinsic monohydride (SiH) rich amorphous silicon layer is formed by applying a glow discharge energy having an intensity of at least 20 KJ per unit mass of disilane, and the p-type dihydride ($SiH_2$) rich amorphous silicon window layer is formed by applying a glow discharge energy having an intensity of less than 8.5 KJ per unit mass of disilane.

By decomposing disilane with a relatively high energy of at least 20 KJ/g-$Si_2H_6$, i-type a-Si:H having high photosensitivity suitable as an optically active layer can be obtained at a high speed of formation exceeding 10 Å, preferably 20 Å/sec. The i-type a-Si:H has an Eopt of 1.75 to 1.78 eV. On the other hand, the p-type dihydride ($SiH_2$) rich amorphous silicon is formed by using a low glow discharge energy of less than 8.5 KJ/g-$Si_2H_6$. As a result, these dihydride ($SiH_2$) rich amorphous silicon films have an Eopt of at least 1.8 eV, and are suitable as a window material.

The i-type a-Si:H suitable as an optically active layer is formed by a glow discharge energy of at least 20 KJ/g-$Si_2H_6$ as described above. It is undesirable however to apply a glow discharge energy high enough to cause crystallization. The a-Si:H formed by applying such a high energy as to cause crystallization has reduced photosensitivity and is undesirable for use as the optically active layer. The energy which causes crystallization varies depending upon the rate of film deposition and is difficult to illustrate specifically. Experimentally, it has been confirmed by electron beam diffraction that at a film deposition rate of 10 Å/sec, the resulting films remain amorphous by applying an energy of up to 300 KJ/g $Si_2H_6$.

The p-type dihydride ($SiH_2$) rich amorphous silicon as the window material is formed by applying a glow discharge energy of less than 8.5 KJ/g-$Si_2H_6$. There is no restriction on the lower limit of the glow discharge energy, and it may be of any intensity which can create a stable flow discharge condition. The intensity of this glow discharge energy varies depending upon the state of the glow discharge device and the state of the starting gas. As a preferred example, when disilane alone or a disilane diluted with a diluent gas such as helium or argon is used as the starting gas, the lower limit of the energy intensity is 0.5 KJ/g-$Si_2H_6$. In the case of dilution with hydrogen ($H_2$), the lower limit is 1.5 KJ/g-disilane.

The thickness of the a-Si:H layer is about 50 to 500 Å for the p-type, and about 3000 to 7500 Å for the i-type.

In summary, the preferred range of the glow discharge energy in this invention is 20 to 300 KJ/g of disilane in the formation of optically active i-type a-Si:H, and 0.5 to 8.5 KJ/g-disilane, preferably 0.5 to 5 KJ/g-disilane in the formation of p-type window material. disilane in this invention is calculated in accordance with the following equation.

$$\text{Glow discharge energy (J/g-Si}_2\text{H}_6\text{)} = \frac{\text{Glow discharge power applied}}{\text{Flow rate of the starting gas} \times \frac{\text{Average molecular weight}}{22.4}} \times \text{Weight fraction of disilane} \quad (I)$$

For example, when a glow discharge power of 100 W is to be applied to a starting gas composed of disilane diluted to 10% by volume with helium (500 cc/min.), the glow discharge energy is calculated as follows:

The average molecular weight of the starting gas $= (62.2184 \times 0.1 + 4.0026 \times 0.9) = 9.824$ (gr)

The weight fraction of $Si_2H_6 = 2184 \times 0.1/9.824 = 0.633$.

Hence, the energy per unit mass of disilane is calculated as $$\frac{100}{\frac{0.5}{60} \times \frac{98.24}{22.4}} \times 0.633 = 17.3 \times 10^3 \, [\text{J/g-Si}_2\text{H}_6]$$

If $10^3$ is expressed as KJ, the above energy is about 17.3 KJ/g-disilane.

In the formation of a-Si:H, the flow rate of the starting gas is preferably large. In the above equation (I) for calculating the energy, the flow rate is the denominator. Hence, the larger the flow rate, the greater the flow discharge power that can be applied. Furthermore, the allowable range of variations of the power is increased, and the discharge can be easily controlled. The speed of formation of a-Si:H is increased with increasing flow rate. In addition to these advantages, the variations of the electrical conductivity of the p-type a-Si:H are reduced, and the photosensitivity of the i-type a-Si:H increases. The preferred range of the flow rate is difficult to define since it varies depending upon the shape, capacity, material, etc. of the glow discharge equipment. However, generally used flow rates are in the range of 7-1000 SCCM. In the formation of the i-type a-Si:H, the flow rate of the starting gas may be that which can maintain a formation speed of more than 10 Å, per second, preferably about 20 to 100 Å per second.

To improve the photovoltaic conversion efficiency of the amorphous silicon semiconductor film further, it is preferred to form a-Si:H under an elevated pressure of 1 to 10 torr (0.1 to 1 torr as the partial pressure of disilane). The higher the pressure, the larger the photo-voltaic conversion efficiency. No clear reason has been given to it, but it is presumed that since the elevation of the pressure decreases the mean free path of plasma, the plasma does not directly act to damage the substrate, electrodes or a-Si:H layers.

The temperature at which a-Si:H is formed is not more than 450° C., preferably 100 to 400° C. Generally, Eopt increases at low temperatures, but the electrical conductivity decreases. At temperatures lower than 100° C., the formation of the a-Si:H film does not effectively proceed. The film peels off, or a yellow amorphous silicon powder occurs, and the objects of this invention cannot be achieved. On the other hand, if it exceeds 400° C., there is no problem in the formation of a-Si:H. But further elevation of the temperature degrades the electrical properties of a-Si:H. Moreover, at such a temperature, the heat resistance of the substrate or electrode becomes a problem. If the substance or electrode becomes defective owing to heat, the efficiency of the solar cell is also decreased. Usually, it is preferred to avoid formation of a-Si:H at temperatures exceeding 400° C.

Now, the production of a solar cell using a p-type dihydride ($SiH_2$)-rich amorphous silicon film as window material on a light incidence side will be described by the following specific embodiment.

A glass substrate having a transparent first electrode is placed in a reaction chamber adapted for glow discharge, and maintained at a temperature of 100 to 400° C. under reduced pressure. Preferably, this temperature is adjusted to a point not exceeding the temperature at which the i-layer is formed. Then, a substance capable of imparting p-type electric conductivity, disilane and a diluent gas are introduced into the reaction chamber as starting materials. A glow discharge energy of less than 8.5 KJ, preferably less than 5 KJ, per unit mass of disilane is applied, and the materials are subjected to glow discharge under a pressure of 1 to 10 torr. As a result, a p-type dihydride (SiH2) rich amorphous silicon layer is formed on the first electrode as a window. Then, disilane and a diluent gas are used as starting materials, and a glow discharge energy of 20 to 300 KJ/g-disilane is applied to the materials at a temperature of 200 to 400° C. under a pressure of 1 to 10 torr to form an i-type a-Si:H layer on the p-type amorphous silicon window layer. Then, an n-type a-Si:H layer was formed on the i-type a-Si:H layer by using a substance capable of imparting n-type electrical conductivity, disilane and a diluent gas. Finally, a second electrode is formed on the n-type a-Si:H layer. As a result, the amorphous silicon solar cell of this invention is obtained.

The production of a solar cell by forming n-type, i-type and p-type amorphous silicon layers successively on the substrate is also within the technical scope of the present invention.

The above conditions for the production of solar cells can of course be applied when only one film layer is formed on the substrate as will be shown later in Examples.

When the i-type a-Si:H layer is formed by applying glow discharge to a starting gas further containing a very small amount (less than 3 vppm) of $B_2H_6$, the efficiency of the resulting solar cell can be further increased. In this embodiment, it is preferred for the controlling of the boron content that the p-type, i-type and n-type amorphous silicon layers be formed separately in separate glow discharge chambers connected to each other.

There is no particular restriction in this invention on the material for the substrate, and on the first and second electrode materials, and those materials used in the prior art can be effectively used. For example, the substrate may be an insulating or electrically conductive, transparent or non-transparent material. Specific examples are films or plates of glass, alumina, silicon, stainless steel, aluminum, molybdenum, and thermally stable polymers. The first or second electrode material should be transparent or light-pervious if used on the light incidence side. Otherwise, there is no restriction on the electrode material. Examples of effective electrode materials include films or thin plates of aluminum, molybdenum, Nichrome, ITO, tin oxide and stainless steel.

Thus, according to the present invention, there is provided a technique of producing a dihydride-rich p-type amorphous silicon film containing at least 25 atomic % of hydrogen in the form of dihydride ($SiH_2$) by applying a glow discharge energy of low power to a gas predominantly of disilane to decompose it, and using the resulting film as a window material.

Strictly speaking, the dihyride ($SiH_2$)-rich p-type amorphous silicon film in this invention contains 29 to 39 atomic % of hydrogen in total, 25 to 36 atomic % of which is in the form of dihydride ($SiH_2$) and 3 to 6 atomic % of which is in the form of monohydride (SiH). Furthermore, the monohydride (SiH)-rich intrinsic amorphous silicon film (i-layer) in this invention contains 15 to 22 atomic % of hydrogen in total, 2 to 7 atomic % of which is in the form of dihydride ($SiH_2$) and 12 to 6 atomic % of which is in the form of monohydride (SiH).

The total content of hydrogen and the contents of hydrogens in the form of $SiH_2$ and SiH in this invention are measured in accordance with the method of G. Lucovsky et al., Phys. Rev. B 19 (1979) 2064, and C. J. Fang et al., J. Non-Cryst. Solids 35-36 (1980), 255. The content of hydrogen in the form of $SiH_2$ is determined from the intensity of absorptions around 2100 $cm^{-1}$ in the infrared absorption spectrum, and the content of hydrogen in the form of SiH, from the intensity of absorptions around 2,000 $cm^{-1}$.

The window material in this invention is formed of only silicon without using carbon or nitrogen at all, and has a broad band gap. Moreover, since it is formed from disilane as a material, it can be formed at a high speed. Broadsky et al. cited above strongly excluded the use of the dihydride-rich semiconductor film on the ground that it has very undesirable properties. Accordingly, the fact that the dihydride-rich amorphous silicon film can be a very good window material is quite unexpected and surprising in view of the disclosures of Brodsky et al. who state that monohydrogenated amorphous silicon is the most desirable hydrogenated material for semiconductor films, or the formation of dihydride groups should be avoided.

The present invention further provides a method for forming a solar cell having excellent properties at a speed as high as more than 20 Å/sec. which comprises superimposing on the dihydride-rich window material a monohydride (SiH)-rich i-type amorphous film obtained by applying a glow discharge energy of high power to a gas predominantly of disilane and thereby discomposing it.

The following examples illustrate the present invention more specifically.

EXAMPLES 1-15

Preparation of p- and i-type silicon films

In order to show the relation among the Eopt of a film having p-type electrical conductivity, the rate of depositing an i-type a-Si-H film, the flow rates of starting gases, and the glow discharge energy, p- and i-type silicon films were separately prepared prior to the formation of an amorphous silicon solar cell.

A glass substrate (7059, produced by Corning Company) was set in a substrate setting section of a capacitance-coupling type high frequency plasma chemical vapor deposition (CVD) device including a substrate heating means, an evacuating means, a gas introducing means and a glow discharge chamber having parallel plate electrodes adapted for setting the substrate thereon.

While evacuating the inside of the glow discharge chamber to less than $10^{-7}$ torr by an oil diffusion pump, the glow discharge chamber was heated so that the temperature of the substrate setting portion (the temperature of forming a film) reached each of the points indicated in Table 1. Disilane diluted with He (dilution ratio $Si_2H_6/He=1/9$) and $B_2H_6$ diluted with $H_2$ (dilution ratio $B_2H_6/H_2=1/99$) were selected and introduced at the flow rates shown in Table 1, and by glow discharge, a silicon film was formed. The flow rates of disilane and $B_2H_6$ in Table 1 show the total flow rates including the diluent gases.

The film thickness was measured by a surface roughness tester.

The rate of depositing the i-type a-Si:H film is the quotient of the time required to form the film in a thickness of about 5000 Å divided by the film thickness.

The electrical conductivity was determined by forming electrodes spaced apart from each other by 200 microns, applying a voltage across these electrodes at room temperature, and measuring the resulting current.

The Eopt was determined by measuring the coefficient $\alpha$ of light absorption of the silicon film by a spectrophotometer, plotting $(\alpha h\nu)^{\frac{1}{2}}$ against the energy $(h\nu)$ of incident light, extrapolating its straight-line portion, and determining the $h\nu$ intercept.

The results are shown in Table 1.

FIG. 1 shows a typical infrared absorption spectrum of the dihydride-rich p-type amorphous silicon film in this invention. This film contains 30.2 atomic % of hydrogen in total with 27.3 atomic % thereof being in the form of dihydride ($SiH_2$) and 3.0 atomic % thereof being in the form of monohydride (SiH).

FIG. 2 shows a typical infrared absorption spectrum of the monohydride-rich i-type amorphous silicon film in this invention. This film contained 18.7 atomic of hydrogen with 14.0 atomic % thereof being in the form of monohydride (SiH) and 4.7 atomic % thereof being in the form of dihydride ($SiH_2$).

TABLE 1

| Example | Flow rate of disilane (cc/min.) | Flow rate of $B_2H_6$ (cc/min.) | Discharge energy (KJ/g-$Si_2H_6$) | Deposition temperature (°C.) | Deposition rate (Å/sec) | Eopt (ev) | Conductivity (S-cm$^{-1}$) | Hydrogen content (atomic %) Total | $SiH_2$ | SiH | Remarks |
|---|---|---|---|---|---|---|---|---|---|---|---|
| 1 | 300 | 0 | 20.4 | 300 | 20 | 1.76 | $2.5 \times 10^{-10}$ | 21 | 6 | 15 | i-type |
| 2 | 300 | 0 | 43.0 | 300 | 18 | 1.76 | $1.7 \times 10^{-10}$ | 19 | 5 | 14 | a-Si:H |
| 3 | 500 | 0 | 23.3 | 300 | 27 | 1.78 | $1.6 \times 10^{-10}$ | 21 | 6 | 15 | film |
| 4 | 500 | 0 | 26.0 | 300 | 35 | 1.77 | $1.9 \times 10^{-10}$ | 20 | 5 | 15 | |
| 5 | 500 | 0 | 43.0 | 300 | 30 | 1.77 | $1.2 \times 10^{-10}$ | 17 | 3 | 14 | |
| 6 | 500 | 0 | 43.0 | 350 | 29 | 1.75 | $2.2 \times 10^{-10}$ | 15 | 2 | 13 | |
| 7 | 500 | 0 | 43.0 | 250 | 31 | 1.79 | $9 \times 10^{-11}$ | 22 | 7 | 15 | |
| 8 | 100 | 0 | 43.0 | 300 | 9 | 1.75 | $1.4 \times 10^{-9}$ | 20 | 4 | 16 | |
| 9 | 300 | 60 | 1.7 | 250 | 6 | 1.80 | $1.2 \times 10^{-3}$ | 29 | 25 | 4 | p-type |
| 10 | 300 | 60 | 1.7 | 200 | 6 | 1.81 | $5.2 \times 10^{-4}$ | 30 | 27 | 3 | a-Si:H |
| 11 | 500 | 60 | 1.7 | 150 | 6 | 1.83 | $1.8 \times 10^{-4}$ | 39 | 36 | 3 | film |
| 12 | 50 | 10 | 1.7 | 250 | 3.3 | 1.92 | $3.1 \times 10^{-5}$ | 32 | 28 | 4 | |
| 13 | (pure $Si_2H_6$) 10 | 60 | 5.0 | 200 | 12 | 1.95 | $2.3 \times 10^{-5}$ | 33 | 30 | 3 | |
| 14 | ($Si_2H_6/H_2$ = 1:1) 60 | 30 | 8.2 | 150 | 8 | 1.93 | $2.6 \times 10^{-5}$ | 35 | 32 | 3 | |
| 15 | (pure $Si_2H_6$) 1.0 | 6.0 | 3.0 | 200 | 2.3 | 1.93 | $2.2 \times 10^{-5}$ | 34 | 31 | 3 | |

The present inventors have already found experimentally that in the formation of an i-type a-Si:H film, the effect of the glow discharge energy on the film forming speed is little when the glow discharge energy is at least 10 KJ/9 disilane, and the speed of film formation is substantially determined by the flow rate of disilane alone. This is also demonstrated by FIG. 3 which was prepared by plotting the results of Examples 1, 2, 3, 4, 5 and 6. It is seen from this figure that when glow discharge is carried out by applying an energy of at least 20 KJ/g-disilane, the speed R of silicon film deposition does not depend upon the applied energy, but varies depending upon the flow rate V alone. It is presumed from FIG. 3 that when disilane diluted with He to 10% by volume is used, the flow rate of disilane corresponding to a silicon film deposition rate of more than 10 Å per second will be at least 110 cc/min. (at least 11 cc/min. as pure disilane).

EXAMPLES 16-18 and COMPARATIVE EXAMPLES 1-2

Preparation of an amorphous silicon solar cell (the p-type dihydride-rich amorphous silicon was placed on the light incidence side as a window)

In each run, a solar cell was produced by properly combining the conditions for forming the i-type and p-type amorphous silicon layers in the above Examples, and its characteristics were measured.

A pin-type amorphous silicon solar cell was produced by using the same plasma CVD apparatus as used in Examples 1 to 13, and its characteristics were measured.

Specifically, a glass substrate having a transparent electrode (first electrode) was set in the CVD apparatus and while evacuating the glow discharge chamber to less than $10^{-7}$ torr by an oil diffusion pump, it was heated so that the temperature of forming the silicon films became 250° C. The same disilane (50 cc/min.) and $B_2H_6$ diluted with $H_2$ to 0.1% by volume (10 cc/min.) as used in the foregoing Examples with a doping ratio (the volume ratio of $B_2H_6/Si_2H_6$) of 2% were introduced into the reaction chamber. A glow discharge energy of each of the intensities shown in Table 2 was applied under a pressure of 2 torr for 30 seconds to form a p-type amorphous silicon film having a thickness of about 100 Å. For example, when the glow discharge power is 2.5 to 4.4 W, the glow discharge energy is calculated as about 1.7 to 3.0 KJ/g-disilane. Under the same conditions, only a p-type amorphous silicon film was formed, and the amount of hydrogen as $SiH_2$ was measured. The results are shown in Table 2.

The temperature of film formation was then elevated to 280° C., and disilane was added at a rate of 500 cc/min., and a glow discharge energy of each of the intensities shown in Table 2 was applied under a pressure of 5 torr to form an i-type amorphous silicon film having a thickness of about 4200 Å. Then, disilane (50 cc/min.) and $PH_3$ diluted to 0.1% by volume with $H_2$ (10 cc/min.) were introduced, and an n-type amorphous silicon film having a thickness of about 100 Å was formed by glow discharge at 250° C. for 40 seconds. Finally, as a back electrode (second electrode), an aluminum film was formed by vacuum evaporation.

For comparison, solar cells were prepared under the same conditions as above except that the energy applied for forming the p-type amorphous silicon film was changed as shown in Table 2. Likewise, the atomic % of H as $SiH_2$ in the p-layer was measured, as is shown in Table 2.

The properties of the solar cells were determined when light of AM1 was irradiated from the side of the substrate by using a solar simulator. The results are shown in Table 2.

In the Examples (in which dehydride-rich amorphous silicon was used as a window), the open end voltage (Voc) was higher than in the Comparative Examples (in which monohydride-rich amorphous silicon was used as a window), and reached 0.85 to 0.89 V. The short circuit current (Jsc) increased by 20 to 50%, and reached 12.6 mA/cm². The photovoltaic conversion efficiency was more than 6%. In these Examples, the above very good conversion efficiency could be achieved in spite of the fact that the time required for forming the amorphous silicon films was 3 minutes and 10 seconds in total which is less than one-tenth of the time required in the prior art. This is a great advantage of the present invention.

TABLE 2

| | i-type forming energy [KJ/g-$Si_2H_6$] | p-type forming energy [KJ/g-$Si_2H_6$] | Voc [V] | Jsc [mA/cm²] | Photovoltaic conversion efficiency [%] | Hydrogen content (atomic %) in the p-layer as a window | | | Hydrogen content (atomic %) in the i-layer | | |
|---|---|---|---|---|---|---|---|---|---|---|---|
| | | | | | | Total | $SiH_2$ | SiH | Total | $SiH_2$ | SiH |
| Example | | | | | | | | | | | |
| 16 | 20 | 1.7 | 0.89 | 10.1 | 5.03 | 31 | 29 | 3 | 22 | 7 | 15 |
| 17 | 26 | 2.5 | 0.85 | 12.6 | 6.21 | 31 | 28 | 3 | 20 | 5 | 15 |
| 18 | 43 | 3.0 | 0.85 | 11.2 | 5.42 | 31 | 27 | 4 | 18 | 4 | 14 |
| Comparative Example | | | | | | | | | | | |
| 1 | 26 | 13.0 | 0.77 | 8.5 | 3.34 | 27 | 21 | 6 | 20 | 5 | 15 |
| 2 | 26 | 17.3 | 0.78 | 8.3 | 3.37 | 28 | 20 | 8 | 20 | 5 | 15 |

EXAMPLES 19-21 AND COMPARATIVE EXAMPLE 3

Production of amorphous silicon solar cells from disilane having different monosilane contents Solar cells were produced by using disilane having different monosilane contents in a plasma CVD apparatus comprised of a substrate setting chamber, chambers for forming a p-type layer, an optically active layer and an n-type layer, and a chamber for withdrawing the substrate.

The conditions for forming the p-type layer were as follows:

Pressure: 0.7 torr
Temperature: 150° C.
Discharge energy: 8.2 KJ/g-disilane
$B_2H_6/Si_2H_6$: 0.1% by volume
$Si_2H_6/H_2$: 0.5 by volume Disilane having a monosilane content of less than 0.1% by volume (Example 19), 1% by volume (Example 20) or 10% by volume (Example 21) was used. The thickness of the p-type layer (window layer) was adjusted to about 100 Å. Under the same conditions, a p-type amorphous silicon film alone was formed, and the amount of H as $SiH_2$ was measured. The results are shown in Table 3.

The substrate was then transferred to the chamber for forming the optically active layer, and by glow discharge decomposition of disilane, an optically active layer having a thickness of about 5000 Å was formed at a a-Si:H film forming speed of 25 Å/sec. The energy supplied was 60 KJ/g-disilane. The temperature of film formation was 300° C., and the pressure of film formation was 0.3 torr. After forming the optically active layer the substrate was transferred to the chamber for forming the n-type layer. In the n-type layer forming chamber, an n-type layer having a thickness of 100 Å was formed at 150° C. in the copresence of PH$_3$. The substrate was taken out through the substrate withdrawing chamber. An aluminum electrode was formed on the n-type layer by vacuum evaporation.

The solar cell of Example 19 showed the following characteristics when light of AMI was irradiated onto it by a solar simulator.

Jsc: 11.3 mA/cm$^2$
fill factor: 0.65
Photovoltaic conversion efficiency: 6.39%

The characteristic values of the solar cells of Examples 20 and 21 are shown in ratios in Table 3 by taking each characteristic value mentioned above as 1.

For comparison, an amorphous silicon solar cell was produced by the same procedure as above except that disilane having a monosilane content of 50% by volume was used (Comparative Example 3). In this Comparative Example, the speed of forming a-Si:H films was 23 to 26 Å/sec which was little different from the method of this invention. However, the characteristic values of this solar cell were extremely inferior to those of the solar cells in Examples 19 to 21. These characteristic values are shown in Table 3 in ratios by taking each of the characteristic values of the solar cell of Example 19 as 1.

Table 3 below shows that to form the window in accordance with this invention, it is essential to decompose a starting gas consisting substantially of disilane by glow discharge, and when the amount of monosilane in the starting gas exceeds 10 %, the objects of the present invention cannot be achieved. As the amount of monosilane increases, the SiH content of the i-layer decreases and its SiH$_2$ content increases. This shows that the film property of the i-layer is degraded.

glow discharge energy at this time is calculated as about 8.4 KJ/g-SiH$_4$. The temperature was then raised to 280° C., and disilane (500 cc/min.) was added. By applying a glow discharge energy of 26 KJ/g-Si$_2$H$_6$ under a pressure of 5 torr for 2 minutes, an i-type amorphous silicon film having a thickness of about 4200 Å was formed. Then, disilane (50 cc/min.) and PH diluted with H$_2$ to 0.1% by volume (10 cc/min.) was introduced, and by glow discharge at 250° C. for 40 seconds, an n-type amorphous silicon film having a thickness of about 100 Å was formed. Then, an aluminum film as a back electrode (second electrode) was formed by vacuum evaporation.

When the light of AMI was irradiated on the resulting solar cell by a solar simulator, it showed an open end voltage (Voc) of 0.65 V, a short circuit current (Jsc) of 6.2 mA/cm$^2$, and a photovolatic conversion efficiency of 2.42%. These characteristics were much inferior to those of the solar cells obtained in accordance with the present invention (Examples).

What is claimed is:

1. A window material for solar cell consisting of a dehydrogenated silicon (SiH$_2$)-based p-type amorphous silicon semiconductor film having an optical band gap of at least 1.8 eV and containing 29 to 39 atomic percent of hydrogen with 25 to 36 atomic percent thereof being in the form of dihydride (SiH$_2$) and 3 to 6 atomic percent thereof being in the form of monohydride (SiH), said window material being formed by decomposing on a substrate a gaseous mixture composed of disilane, a substance capable of imparting p-type electrical conductivity and a diluent gas by applying a flow discharge energy in the range of 0.5 to 8.5 KJ/g-disilane.

2. The window material for solar cell of claim 1

TABLE 3

| | Content of SiH$_4$ (vol %) | Jsc | Fill factor | Photovoltaic conversion efficiency [%] | Hydrogen content (atomic %) in the p-layer as a window | | | Hydrogen content (atomic %) in the i-layer | | |
|---|---|---|---|---|---|---|---|---|---|---|
| | | | | | Total | SiH$_2$ | SiH | Total | SiH$_2$ | SiH |
| Example | | | | | | | | | | |
| 19 | less than 0.1 | 1 | 1 | 1 | 33 | 29 | 4 | 18 | 3 | 15 |
| 20 | 1 | 0.95 | 1.01 | 0.95 | 33 | 29 | 4 | 18 | 4 | 14 |
| 21 | 10 | 0.84 | 0.90 | 0.69 | 31 | 25 | 6 | 19 | 7 | 12 |
| Comparative Example | | | | | | | | | | |
| 3 | 50 | 0.76 | 0.74 | 0.47 | 29 | 21 | 8 | 20 | 10 | 8 |

COMPARATIVE EXAMPLE 4

Production of an amorphous silicon solar cell by forming a p-type layer (window) using monosilane, and an i-type layer using disilane A pin-type amorphous silicon solar cell was produced by using the same plasma CVD apparatus, and its characteristics were measured, as used in Examples 1 to 15.

Specifically, a glass substrate having a transparent electrode (first electrode) was placed in the CVD apparatus, and while it was evacuated to less than 10$^{-7}$ torr by an oil diffusion pump, the substrate was heated so that the temperature of film formation became 250° C. Monosilane (50 cc/min.) and B$_2$H$_6$ diluted with H$_2$ to 0.1% by volume (10 cc/min.) were introduced, and by applying a glow discharge power of 5 W under a pressure of 2 torr for 30 seconds, a p-type amorphous silicon film having a thickness of about 100 Å was formed. The wherein it has an optical band gap of at least 1.9 eV.

3. An amorphous silicon solar cell comprised of a substrate having a first electrode, (a) an amorphous silicon layer, as a window, having p-type electrical conductivity and containing 29 to 39 atomic percent of hydrogen with 25 to 36 atomic percent thereof being in the form of dihydride (SiH$_2$) and 3 to 6 atomic percent thereof being in the form of monohydride (SiH), (b) an intrinsic layer having a hydrogen content of 15 to 22 atomic percent with 2 to 7 atomic percent thereof being in the form of dihydride (SiH$_2$) and 12 to 16 atomic percent thereof being in the form of monohydride (SiH), (c) an amorphous silicon layer having n-type electrical conductivity, and a second electrode formed on the substrate said layers (a), (b) and (c) being arranged in the order (a), (b) and (c), or in the reverse order (c), (b), and (a), the amorphous silicon layer having p-type electrical conductivity being located as a window facing incident light, said amorphous silicon layer as a window being formed by applying a glow discharge energy in the range of 0.5 to 8.5 KJ/g-disilane to a gaseous mixture composed of disilane, a substance capable of imparting p-type electrical conductivity and a diluent gas, and said intrinsic amorphous silicon layer being formed by applying a discharge energy in the range of 20 to 300 KJ/g-disilane to disilane or a gaseous mixture of disilane and diluent gas.

4. The amorphous silicon solar cell of claim 3 wherein the window material has an optical band gap of 1.9 eV.

5. The amorphous silicon solar cell of claim 3 wherein the formation of the window layer is carried out at a temperature lower than that used in the formation of the intrinsic amorphous silicon layer.

6. The amorphous silicon solar cell of claim 3 wherein the substance capable of imparting p-type electrical conductivity is $B_2H_6$.

* * * * *